United States Patent
Fornara et al.

(10) Patent No.: US 8,536,886 B2
(45) Date of Patent: Sep. 17, 2013

(54) INTEGRATED CIRCUIT CHIP IDENTIFICATION ELEMENT

(75) Inventors: Pascal Fornara, Pourrieres (FR); Christian Rivero, Luynes (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 387 days.

(21) Appl. No.: 12/815,663

(22) Filed: Jun. 15, 2010

(65) Prior Publication Data

US 2010/0321049 A1 Dec. 23, 2010

(30) Foreign Application Priority Data

Jun. 17, 2009 (FR) ...................................... 09 54056

(51) Int. Cl.
*G01R 27/08* (2006.01)
(52) U.S. Cl.
USPC ........................................................ 324/706
(58) Field of Classification Search
USPC .......................... 324/691–718; 257/620, 531
See application file for complete search history.

(56) References Cited

U.S. PATENT DOCUMENTS

| 5,189,362 A | * | 2/1993 | Doble ........................... 324/106 |
| 6,161,213 A | | 12/2000 | Lofstrom |
| RE40,188 E | | 3/2008 | Lofstrom |
| 2004/0053429 A1 | | 3/2004 | Muranaka |
| 2008/0028349 A1 | * | 1/2008 | Muranaka ......................... 716/5 |
| 2011/0003421 A1 | * | 1/2011 | Kumar et al. ..................... 438/48 |

OTHER PUBLICATIONS

French Search Report dated Feb. 17, 2010 from corresponding French Application No. 09/54056.

* cited by examiner

*Primary Examiner* — Melissa Koval
*Assistant Examiner* — Trung Nguyen
(74) *Attorney, Agent, or Firm* — Wolf, Greenfield & Sacks, P.C.

(57) ABSTRACT

Wheatstone bridges, each formed of four identical resistors, are used as integrated circuit identification elements. An identification circuit including an assembly of Wheatstone bridges and comparators is formed in a substrate. Since the resistors forming the bridges are sensitive to technological dispersions, the output voltages of the bridges are not identical. Each comparator compares the outputs of two bridges and provides a bit of an identification number of the chip. Preferably, the resistors are covered with insulator only, at least up to a second interconnect level from the substrate.

12 Claims, 3 Drawing Sheets

INTEGRATED CIRCUIT CHIP IDENTIFICATION ELEMENT

CROSS REFERENCE TO RELATED APPLICATIONS

This application claims the priority benefit of French patent application number 09/54056, filed on Jun. 17, 2009, entitled "INTEGRATED CIRCUIT CHIP IDENTIFICATION ELEMENT," which is hereby incorporated by reference to the maximum extent allowable by law.

BACKGROUND OF THE INVENTION

1. Field of the Invention

The present invention generally relates to the identification of integrated circuit chips by means of an identifier which differentiates one chip from another.

2. Discussion of the Related Art

FIG. 1 is a simplified top view of a wafer 1 of a semiconductor material on which circuits or chips 2, all identical, have been formed. Reference will be made to integrated circuit chips, knowing that each chip may comprise one or several active and/or passive circuit(s). Currently, a much higher number of chips than what is shown is formed on a same wafer. At the end of the manufacturing, chips 2 are separated by being cut, for example by means of a saw, along sawing paths 3 shown in dotted lines. In many applications, it is necessary to have a way to uniquely identify the chips originating from a same manufacturing batch. Such an identifier is, for example, used for recognition or ciphering purposes in devices such as payment cards.

An identification method comprises, for each chip, storing a number in a non-volatile memory of a circuit. This method requires a specific step, be it during the manufacturing (masked writing into a ROM) or after the manufacturing (electric or optical writing process).

Another group of methods comprises identifying a chip based on physical parameters with values linked to the manufacturing uncertainties. Electric parameters of the chip may especially be measured. For example, a threshold voltage of a transistor, a resistance, or a stray capacitance may be measured. Such features are sensitive to dispersions resulting from the inaccuracies of manufacturing technologies. It will be spoken hereafter of technological dispersions. Thus, it can be considered that the parameter(s) taken into account are specific to a chip and form a unique identifier. Currently, a large number of identification elements capable of providing, for each chip, a unique identifier, based on physical parameters linked to the manufacturing of these elements, is provided in the chips. The value differences forming the identifier of a chip are by nature very small. They range within the margin of inaccuracy linked to the manufacturing.

A disadvantage of using a measurement of electric parameters is that these parameters are likely to vary over time, during the lifetime of a circuit. Accordingly, the obtained identifier is not stable. Further, such features may be sensitive to parasitic dispersions especially depending on the temperature of use. A disadvantage of methods based on parameter measurements thus is that identifiers which may vary from one measurement to the next one are obtained.

SUMMARY OF THE INVENTION

Thus, an object of an embodiment of the present invention is to provide a new way to identify a chip based on physical parameters linked to its manufacturing, overcoming at least some of the disadvantages of prior art identification methods.

An object of an embodiment of the present invention is to provide an identification element which is particularly sensitive to technological dispersions, while being time- and temperature-stable.

Another object of an embodiment of the present invention is to provide such an element which does not require the addition of steps to the chip manufacturing process.

Thus, an embodiment of the present invention provides an element for identifying an integrated circuit chip, comprising identical diffused resistors connected as a Wheatstone bridge.

According to an embodiment of the present invention, the diffused resistors are surrounded with an insulating region.

According to an embodiment of the present invention, the integrated circuit is covered with a stack of interconnect levels and of insulating layers, the resistors being only covered with insulator, at least up to the level following the interconnect level closest to the integrated circuit.

According to an embodiment of the present invention, the diffused resistors are bar-shaped.

Another embodiment of the present invention provides a circuit for generating an identification number of an integrated circuit chip comprising a plurality of identification elements according to any of the above-mentioned embodiments.

According to an embodiment of the present invention, this generation circuit comprises a plurality of comparators, each comparator comparing the imbalance values of two Wheatstone bridges, the identification number being formed from the output values of the comparators.

According to an embodiment of the present invention, in which the comparators have two output states, the output of each comparator determines a bit of the identification number.

The foregoing objects, features, and advantages of the present invention will be discussed in detail in the following non-limiting description of specific embodiments in connection with the accompanying drawings.

DETAILED DESCRIPTION

Figure 1:
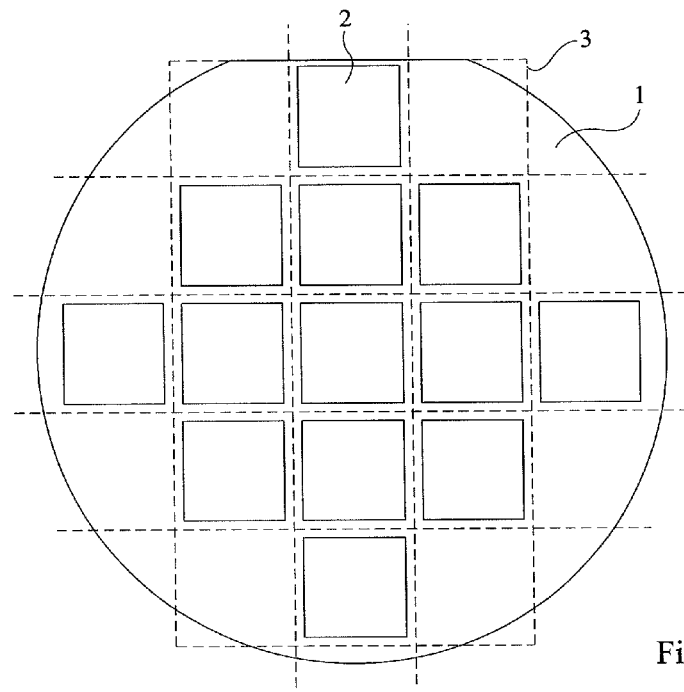
FIG. 1 is a simplified top view of a wafer of a semiconductor material on which integrated circuit chips have been formed.

For clarity, the same elements have been designated with the same reference numerals in the different drawings and, further, as usual in the representation of integrated circuits, the various drawings are not to scale. Only those elements which are necessary to the understanding of the present invention have been shown and will be described hereafter. In particular, the destination and the exploitation made of the generated identifier have not been detailed.

Figure 2:
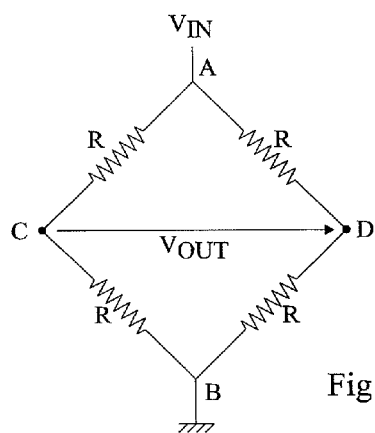
FIG. 2 shows the electric diagram of an element for identifying an integrated circuit chip.

FIG. 2 shows the electric diagram of a Wheatstone bridge formed of four identical resistors R. A first voltage $V_{IN}$ is applied to a first diagonal of the bridge, between nodes A and B. A possible imbalance voltage $V_{OUT}$ appears on a second diagonal of the bridge, between nodes C and D.

Since the resistors have the same values, the Wheatstone bridge is normally balanced and output voltage $V_{OUT}$ is equal to 0 V whatever the value of $V_{IN}$. However, in practice, the resistors are never strictly identical, and the bridge is never strictly balanced. Output voltage $V_{OUT}$ is then different from 0 V.

Wheatstone bridges such as described hereabove are used as chip identification elements. An identification circuit comprising an assembly of identical Wheatstone bridges is formed in each chip. Since the resistors forming the bridges are sensitive to technological dispersions, when the same input voltage $V_{IN}$ is applied to all bridges, it can be observed that output voltages $V_{OUT}$ are not all identical. Thus, the set of imbalance values $V_{OUT}$ of the assembly of bridges is specific to the chip and forms its identifier. An identification circuit comprising from 100 to 200 Wheatstone bridges is, for example, provided to generate the identifier of a chip.

Many methods, not shown, may be used to deduce an identifier from the imbalance values of the bridges. According to an embodiment, an assembly of comparators with two output states is provided, each comparator comparing the output voltages $V_{OUT}$ of two different bridges. The output of each comparator determines a specific bit of an identification number of the chip. However, the present invention is not limited to this sole specific case. It will be within the abilities of those skilled in the art to implement the desired operation whatever the means used to generate an identification number from the imbalance values of the bridges.

An advantage of the use of Wheatstone bridges as an identification element lies in the fact that output voltage $V_{OUT}$ is independent from the circuit temperature. Indeed, although the values of the resistors are likely to vary along with temperature, all the resistors in the same bridge undergo the same drift. Thus, the balancing remains unchanged. The chip identifier is thus temperature-stable.

To obtain good identification performance, the Wheatstone bridges should be sensitive to technological dispersions, while being stable with time.

Figure 3A:
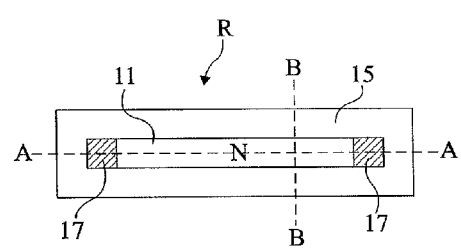
FIGS. 3A to 3C are simplified top and cross-section views showing an embodiment of resistors constitutive of the identification element of FIG. 2.
Figure 3B:
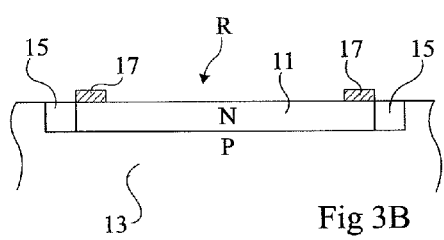
Figure 3C:
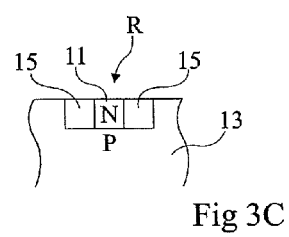

FIG. 3A is a top view schematically showing an embodiment of a resistor R forming the Wheatstone bridge of FIG. 2. FIGS. 3B and 3C are cross-section views schematically showing resistor R of FIG. 3A along axes A-A and B-B shown in dotted lines. Resistor R is a diffused resistor. An N-type doped resistive area 11 is formed in the upper portion of a lightly-doped P-type semiconductor substrate 13. In top view, area 11 has the shape of a rectangular bar. An oxide region 15 is arranged at the periphery of area 11 to insulate resistor R from the rest of the circuit. Conductive pads 17 are arranged at the surface of the substrate, in contact with the ends of resistive area 11.

Figure 4A:
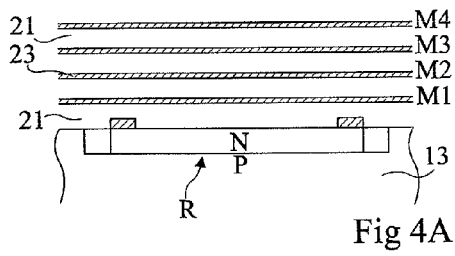
FIGS. 4A and 4B are simplified cross-section views illustrating embodiments of a portion of the identification element of FIG. 2.

FIG. 4A is a cross-section view schematically showing a portion of an integrated circuit chip comprising a diffused resistor R such as described in relation with FIGS. 3A to 3C. Currently, semiconductor substrate 13 of the chip is covered with a stack of insulating layers 21. Conductive interconnect tracks 23 are formed between the insulating layers. There generally exist several successive interconnect levels, M1 to M4 in the shown example, levels M1 and M4 being respectively the closest to and the most remote from substrate 13. Conductive vias, not shown, cross the insulating layers to connect the conductive tracks to one another, to input-output terminals of the chip, and to components of the integrated circuit, thus forming the circuit interconnects.

Figure 4B:
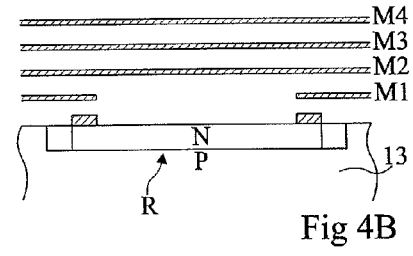

FIG. 4B is a cross-section view showing a specific embodiment of an integrated circuit chip comprising diffused resistors R such as described in relation with FIGS. 3A to 3C. FIG. 4B only differs from FIG. 4A by the arrangement of the interconnect metal tracks. The interconnect metal tracks are arranged so that resistor R is covered with insulator only, at least up to interconnect level M2.

Figure 5:
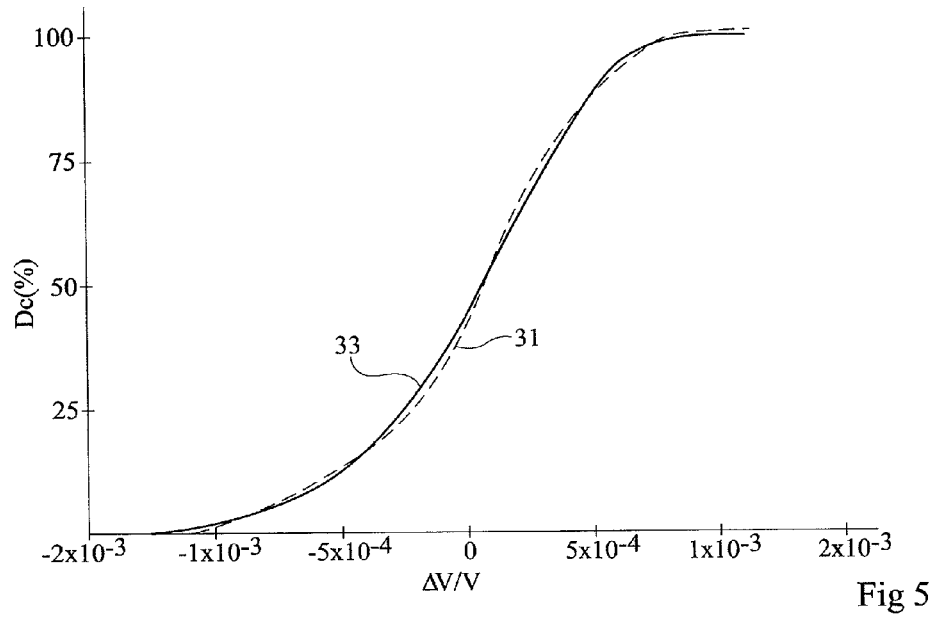
FIGS. 5 and 6 illustrate the technological dispersion and the behavior along time of the embodiments of the identification element of FIG. 2 shows in FIGS. 4B and 4A.

FIG. 5 illustrates the technological dispersion and the behavior along time of an example of a Wheatstone bridge with diffused resistors formed according to the embodiment described in relation with FIG. 4B. The inventors have performed imbalance measurements on identical Wheatstone bridges of a large number of chips of a same manufacturing batch.

Curve 31, in dotted lines, shows the cumulative distribution Dc according to the relative imbalances of the bridges, $\Delta V/V$ or $\Delta I/I$, V and I respectively being the applied voltage and current. This provides a Gaussian distribution with a standard deviation on the order of $10^{-4}$ in this specific example.

Curve 33, in full line, corresponds to the same measurement performed on the same chip batch, 15 months later. It can be observed that the interval between two corresponding points of curves 31 and 33 is extremely small.

Thus, Wheatstone bridges having their diffused resistors covered with insulator only, up to interconnect level M2 have a good technological dispersion and a great stability along time.

Figure 6:
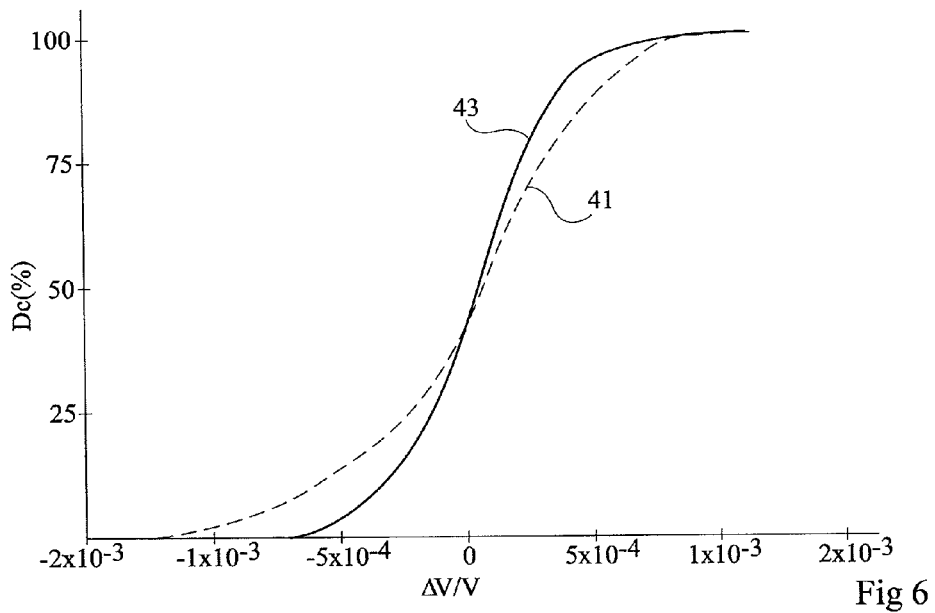

FIG. 6 illustrates the technological dispersion and the behavior along time of an example of a Wheatstone bridge with diffused resistors formed according to the embodiment described in relation with FIG. 4A. The inventors have performed imbalance measurements on identical Wheatstone bridges of a large number of chips of a same manufacturing batch.

Curve 41, in dotted lines, shows cumulative distribution Dc according to the relative imbalances of the bridges, $\Delta V/V$ or $\Delta I/I$. It has a Gaussian distribution.

Curve 43, in full lines, corresponds to the same measurement performed on the same chip batch, 15 months later. It still has a Gaussian distribution with a standard deviation similar to that of the curves of FIG. 5. It can however be observed that the distribution has changed.

It can thus be noted that the time stability of Wheatstone bridges with diffused resistors is downgraded when the resistors are covered with metal tracks from first interconnect level M1 upwards. It is thus not desirable to use this type of Wheatstone bridge to identify a chip.

Figure 7:
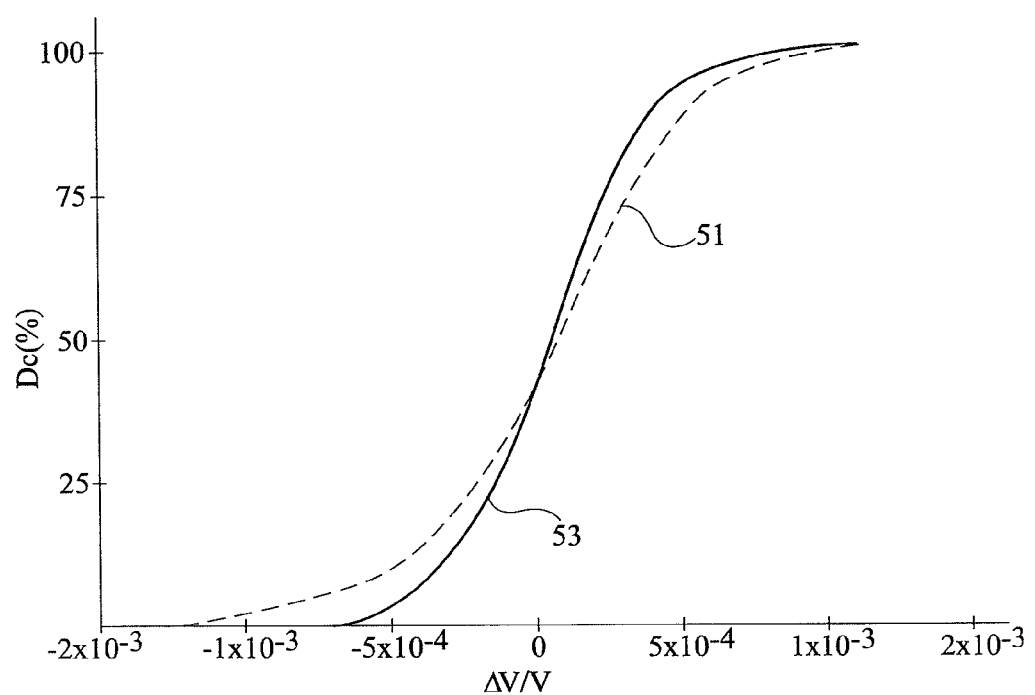
FIG. 7 illustrates the technological dispersion and the behavior along time of an example of a Wheatstone bridge with diffused resistors above which gate polysilicon lines have been maintained.

FIG. 7 illustrates the technological dispersion and the behavior along time of an example of a Wheatstone bridge with diffused resistors above which gate polysilicon lines have been maintained.

Curve 51, in dotted lines, shows cumulative distribution Dc according to the relative imbalances of the bridges, $\Delta V/V$ or $\Delta I/I$. It has a Gaussian distribution with a standard deviation of $10^{-4}$ in this specific example.

Curve 53, in full lines, corresponds to the same measurement performed on the same chip batch, 15 months later. It still has a Gaussian distribution with a standard deviation on the order of $10^{-4}$. It can, however, be observed that the maximum interval between two corresponding points of curves 51 and 53 is significant. The shape of the distribution has changed.

It can thus be noted that Wheatstone bridges with polysilicon resistors have a good dispersion but are not stable with time. It is thus not desirable to use this type of Wheatstone bridge to identify a chip.

The inventors have shown by many trials on different resistor structures that Wheatstone bridges with diffused resistors only covered with insulator, at least up to the second metallization level from the substrate (M2), are the most stable along time. Such bridges further have a good technological dispersion.

An aspect of an embodiment of the present invention provides an identification circuit formed of an assembly of Wheatstone bridges in each chip, the resistors forming the bridges being resistors of the previously-described type.

According to an advantage of an embodiment of the present invention, the provided solution is compatible with usual manufacturing processes and requires no additional manufacturing steps.

Specific embodiments of the present invention have been described. Various alterations and modifications will occur to those skilled in the art. In particular, the resistors forming the Wheatstone bridges of the provided identification circuit, described in relation with FIGS. 3A to 3C, 4A and 4B, are formed in a P-type substrate. It will be within the abilities of those skilled in the art to implement the desired operation in the case where the resistors are formed in an N-type substrate. Further, in the present description, it is provided to measure the imbalance of Wheatstone bridges by voltage measurements across diagonals of the bridges. It will be within the abilities of those skilled in the art to implement the desired operation by measuring the imbalance by current intensity measurements.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for generating an identification number of an integrated circuit chip comprising a plurality of identification elements, each identification element comprising identical diffused resistors connected as a Wheatstone bridge, wherein the integrated circuit is covered with a stack of interconnect levels and of insulating layers, said resistors being covered with insulator only, at least up to a level following an interconnect level closest to the integrated circuit, and a plurality of comparators, each comparator comparing the imbalance values of two Wheatstone bridges, the identification number being formed from the output values of the comparators.

2. The circuit for generating an identification number of claim 1, wherein the diffused resistors are surrounded with an insulating region.

3. The circuit for generating an identification number of claim 1, wherein said diffused resistors are bar-shaped.

4. The circuit for generating an identification number of claim 1, wherein the comparators have two output states, the output of each comparator determining a bit of the identification number.

5. An integrated circuit comprising:
resistors formed in a substrate and connected as at least one Wheatstone bridge to form at least one identification element; and
a stack of interconnect levels and insulating layers covering the substrate, wherein at least a first interconnect level of the interconnect levels, which is closest to the substrate, does not cover the resistors connected as at least one Wheatstone bridge, wherein the resistors formed in the substrate comprise a plurality of Wheatstone bridges, further comprising comparators, each comparing outputs of two Wheatstone bridges and each providing a bit of an identification of the integrated circuit.

6. An integrated circuit as defined in claim 5, wherein the resistors formed in the substrate comprise diffused resistors surrounded with an insulating region.

7. An integrated circuit as defined in claim 5, wherein the resistors of each Wheatstone bridge have equal values.

8. An integrated circuit comprising:
a plurality of resistive bridges formed in a substrate, each bridge comprising resistors connected as a Wheatstone bridge;
a stack of interconnect levels and insulating layers covering the substrate, wherein at least a first interconnect level of the interconnect levels, which is closest to the substrate, does not cover the resistors of the plurality of bridges; and
comparators, each configured to compare outputs of two bridges of the plurality of bridges and to provide a bit of an identification of the integrated circuit.

9. An integrated circuit as defined in claim 8, wherein the resistors of each bridge comprise diffused resistors surrounded by an insulating region.

10. An integrated circuit as defined in claim 9, wherein the resistors of each bridge of the plurality of bridges have equal values.

11. A method of making an integrated circuit comprising:
forming resistors in a substrate, the resistors connected as at least one Wheatstone bridge;
forming a stack of interconnect levels and insulating layers covering the substrate, wherein at least a first interconnect level of the interconnect levels, which is closest to the substrate, does not cover the resistors connected as at least one Wheatstone bridge; and
forming comparators on the substrate, each of the comparators configured to compare the outputs of two bridges of the plurality of bridges and to provide a bit of an identification of the integrated circuit.

12. A method as defined in claim 11, wherein forming resistors comprises forming resistors connected as a plurality of Wheatstone bridges.

* * * * *